(12) United States Patent
Vassallo et al.

(10) Patent No.: US 6,366,094 B1
(45) Date of Patent: Apr. 2, 2002

(54) CONTROL OF MRI SYSTEM

(75) Inventors: Godfrey Vassallo, Northport; Michael Boitano; John Linardos, both of Smithtown; Jevan Damadian, East Northport; Jayne J. Cohen, New Hyde Park; Raymond V. Damadian, Woodbury, all of NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/686,640

(22) Filed: Oct. 11, 2000

Related U.S. Application Data

(62) Division of application No. 08/978,888, filed on Nov. 26, 1997, now Pat. No. 6,157,194
(60) Provisional application No. 60/031,519, filed on Nov. 27, 1996.

(51) Int. Cl.[7] ................................................. G01V 3/00
(52) U.S. Cl. ........................................ 324/322; 324/312
(58) Field of Search ................................... 324/312, 318, 324/322, 306, 307, 309, 300

(56) References Cited

U.S. PATENT DOCUMENTS

| 5,452,416 A | 9/1995 | Hilton et al. ............... 395/161 |
| 5,606,258 A | 2/1997 | Hoenninger, III et al. .. 324/309 |
| 5,726,571 A | 3/1998 | Gluclu et al. ............... 324/322 |
| 5,740,267 A | 4/1998 | Echerer et al. ............. 382/132 |

*Primary Examiner*—Louis Arana
(74) *Attorney, Agent, or Firm*—Lerner, David, Littenberg, Krumholz & Mentlik, LLP

(57) ABSTRACT

A personal computer or "PC" based software control system for a magnetic resonance imaging or "MRI" scanner. The software control system manages various types of MRI scanners without modification of the software control system. The control system manages the scanning process through a device driver interface which abstracts the particulars of the specific hardware used to interface to the magnetic, radio frequency, image display, image acquisition, patient handling and scan control subsystems.

1 Claim, 3 Drawing Sheets

CONTROL OF MRI SYSTEM

CROSS REFERENCE TO RELATED APPLICATION

The present application is a divisional of U.S. application Ser. No. 08/978,888 filed Nov. 26, 1997 now U.S. Pat. No. 6,157,194 and claims the benefit of U.S. Provisional Application No. 60/031,519, filed Nov. 27, 1996, the disclosures of which are hereby incorporated by reference herein.

BACKGROUND OF THE INVENTION

The present invention relates to magnetic resonance imaging or "MRI" and particularly to a personal computer or "PC" based control system and method for an MRI scanner.

Presently, different MRI scanner control systems require control systems which are different from each other. Various MRI providers usually use custom hardware for control of their particular scanner. For instance, different device drivers and related I/O hardware cards are used to interact with, manage and control certain external sub-systems such as the magnet, the radio frequency or "RF" transceiver and the patient handling sub-system.

By way of example only, certain disadvantages are inherent in the present systems available in the MRI industry. For instance, with proprietary hardware based control systems, pulse programmers have to adjust pulse sequence in accordance with the observed affects from the specifics of the hardware of the I/O sub-system. Thus, each pulse sequence has to be adjusted to account for "rippling" effects from the real time system due to the interaction between the hardware and the software. As another example, pulse sequences for imaging have to be specified mathematically and tested on scanner equipment for adjustment to system characteristics. In addition, current MRI scanner control systems are not capable of being used in different systems such as where there may be a different MRI magnet. As Such, for each different MRI magnet, a proprietary and unique MRI scanner control system is required. Finally, by way of example, the resulting image slice from an MRI scan cannot, in real time, be sharpened, smoothed and contrasted in order to increase the resolution of tile selected image.

Thus, it is desirable to have a system and method for controlling an MRI scanner which is capable of being used with different types of MRI scanners and related equipment. It also is desirable to have a personal computer based software control system and method for controlling the MRI scanner systems. Additionally, it is desirable to have an MRI scanner control system wherein an operator can interactively and in real time sharpen, smooth and contrast to adjust the selected image using a pointing device such as an electronic mouse and where the adjusted image can be compared to an unmodified image for further control of same.

SUMMARY OF THE INVENTION

The present invention addresses these needs. The present invention allows MRI scanner manufacturers to reduce the cost of their systems by exploiting the economics of scale implicit in the PC market. This invention also exploits technological advances by standardizing on an industry standard software execution environment while providing the necessary interface required for MRI scanner control. The present invention also overcomes hardware sensitivity by providing a virtual device to the scanner control application. This virtual device accepts a set of command blocks which specify the scan control parameters. The virtual device then translates these generic parameters to the specifics of the current system. A major problem which this general system overcomes is the real time processing requirements implicit in the scanning process.

In general, the present invention comprises a PC-based software control system and method for controlling various types of MRI scanners. The system controls and manages a typical MRI scanner. The PC is interfaced with the scanner's external subsystems such as the magnet, RF generation and patient handling or database system. The subsystems are interfaced through a set of I/O cards. The particulars of these I/O cards are handled through a device driver which presents a consistent interface to the scanner control software. This interface, in effect, presents a virtual scanner I/O subsystem to the scanner control system. This virtual device accepts commands and returns data through an industry standard Application Program Interface (API). The command block contains the waveform shape information as well as timing data for the gradient and RF waves. Additionally, the data acquisition parameters are also specified in the command block.

One aspect of the present invention provides a magnetic resonance imaging or "MRI" scanner system comprising a personal computer having an accessible memory storage medium; an MRI magnet which interfaces with the personal computer; means for controlling and managing input and output information to and from the MRI magnet; a radio frequency or "RF" transceiver for use with the MRI magnet, the RF transceiver being interfaced with the personal computer; an image display unit electronically interfaced with the personal computer for displaying scan data received from the RF transceiver; and a patient database interfaced with the personal computer for retrieving and recording patient data.

Another aspect of the present invention provides an image display system for use with a magnetic resonance image or "MRI" scanner system comprising an image display unit for displaying scanned images from an MRI scan and means for providing interactive, real time simultaneous image sharpening, smoothing and contrast modification of a selected image slice to be displayed on the image display.

Yet another aspect of the present invention provides a multitask, parallel processing magnetic resonance imaging or "MRI" scanner system comprising an image display subsystem for viewing tomographic images and means for interfacing said image display subsystem with a variety of display formats.

DETAILED DESCRIPTION OF THE PREFERRED EMBODIMENTS

Figure 1:
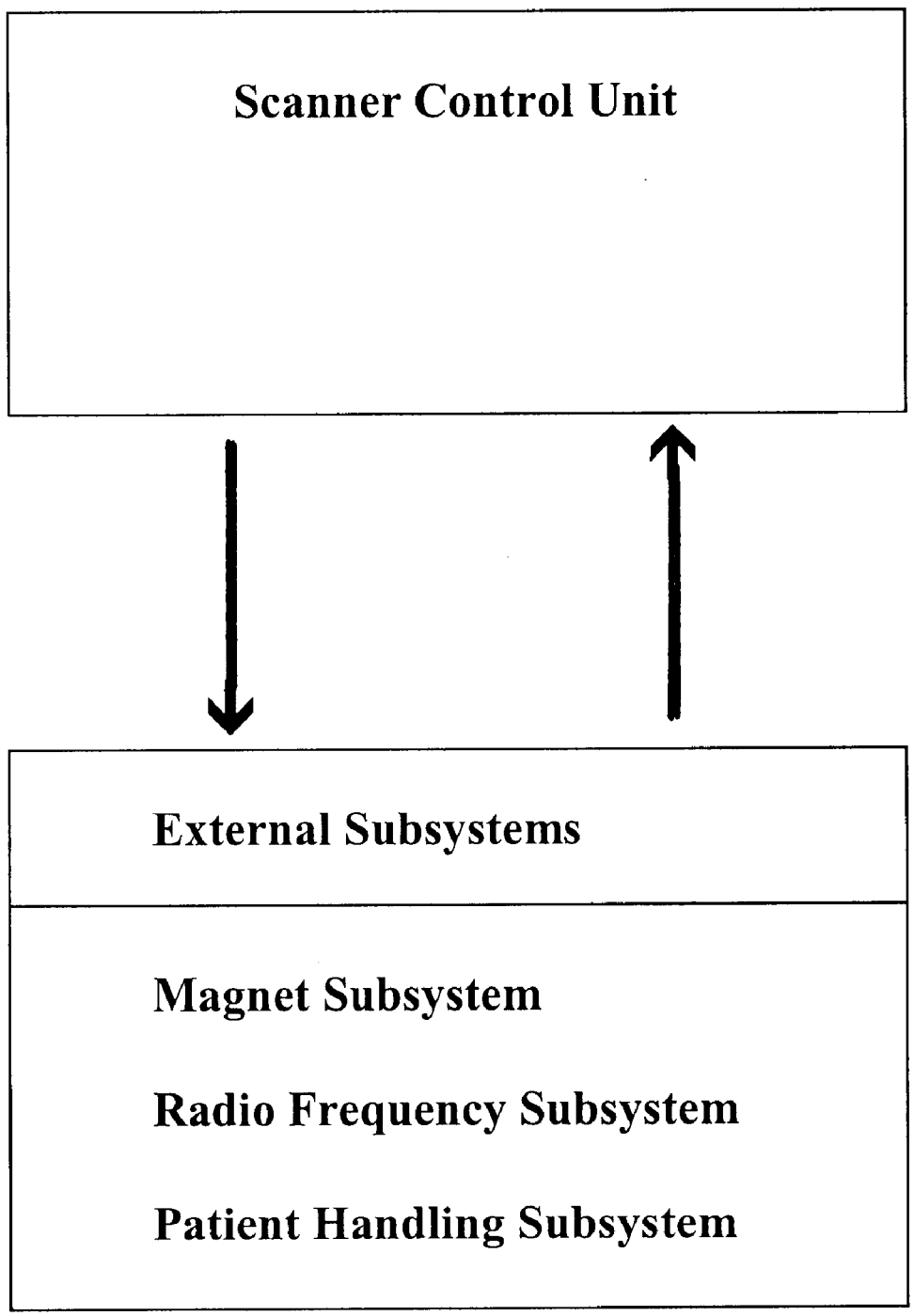
FIG. 1 is a block diagram of a high level relationship between the control system and the scanner system in accordance with one aspect of the present invention.
Figure 2:
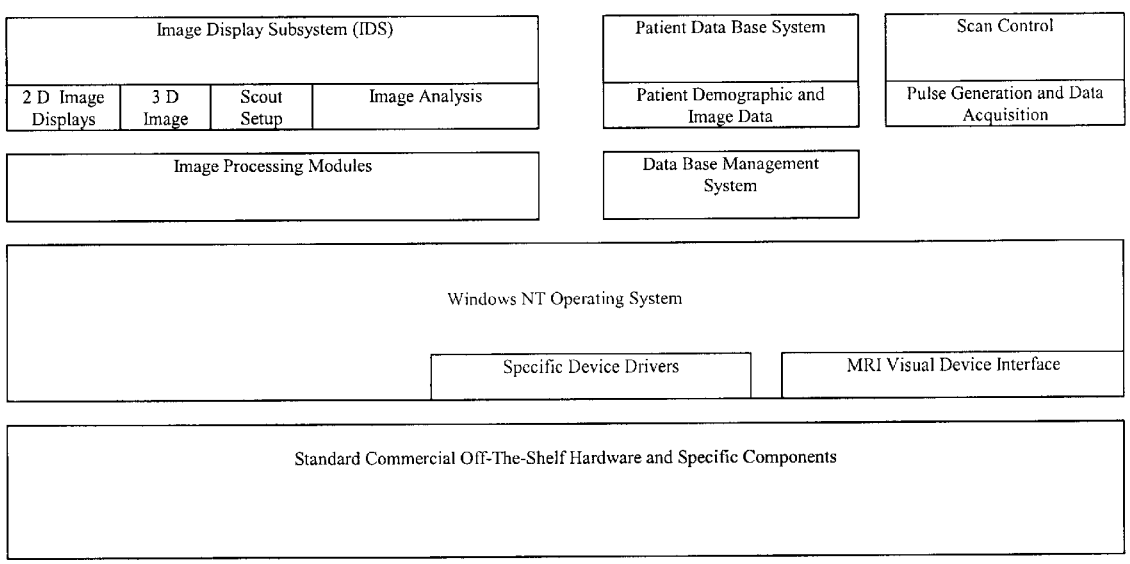
FIG. 2 is a block diagram showing the software used to implement control of the scanner which is divided into three basic function categories, including (1) Image Display Subsystem, (2) Patient Database Subsystem, and (3) Scan Control Subsystem.

Apparatus in accordance with one embodiment of the present invention, as shown in FIGS. 1–2, includes the scanner which is divided into three basic function categories, including (1) Image Display Subsystem (IDS), (2) Patient Database Subsystem, and (3) Scan Control Subsystem.

The Image Display Subsystem allows the operator to view tomographic images on the display monitor. It supports several display formats, and provides zoom, contrast windowing, computation of image statistics, determination of the location and intensity of pixels, region of interest processing, and image processing capabilities (e.g., maximum intensity projections).

The Patient Database Subsystem provides a method for scheduling patients for scanning, collecting patient demographic and medical data, and management of the patient MRI image database. It includes the ability to produce permanent image records on, for example, films, VCR tapes, general image hard copy production. In addition, it provides image storage, retrieval, and archiving capabilities.

The Scan Control Subsystem establishes and controls the required gradients (for example, slice select, frequency, phase encoding), establishes and transmits the RF pulse, digitizes the resultant MRI signal, and reconstructs the MRI image.

Because the MRI system is controlled at the software level, there is almost no sensitivity to the particular I/O hardware cards being used to implement scanner functions. One can change imbedded hardware cards and can even replace these cards with those of different manufacturers without making adjustments to the card itself since the software makes the necessary compensation.

Previously, pulse programmers had to adjust pulse sequence in accordance with the observed effects from the specifics of the hardware of the I/O subsystem. Thus, the pulse sequences had to be adjusted to account for "rippling" effects from the real time system due to strong interactions between the hardware and software. Now, pulse sequences can be specified completely without undue regard to the effects on the hardware.

In the past, pulse sequences for imaging had to be specified mathematically and actually tested on the scanner equipment for adjustment to the system characteristics. The present invention contemplates that the pulse sequence can be "drawn" graphically on the screen by the pulse programmer without the need for formulas to be entered or considering the system characteristics.

The software can also simulate how the system will react to the proposed pulse sequence without actually applying the pulse to the system. This allows for easy debugging and adjustment by the pulse programmer.

Currently, MRI scanner control is done differently by different players in the MRI field who all use different and custom hardware for control of the scanner. The use of software control leads to the standardization of MRI scanner control by virtualization of the functionality associated with scanner control. The particulars relative to the custom hardware are handled by software device drivers. These device drivers present a consistent interface to the rest of the software. This approach is very similar to the way a word processing program controls printing to different types of printers.

Control by software is more reliable because it is less hardware is dependent and thus less susceptible to failure due to physical wear and tear. Additionally, a system whose control is predominately software based is less expensive to service since there are less components which may fail (e.g., problem diagnostics are simpler since there are fewer items to consider). Field upgrades to the system also are made easier through software since it can be remotely downloaded to the target system.

The system, because of its diminished reliance on hardware, can be more easily controlled remotely via LAN or other communications techniques. Remote control of the scanner may be used in tele-medical applications or by field service as an aid during system diagnosis. Remote control also allows an imaging center to better utilize its technicians since a technician, through remote control, can oversee multiple scanners.

In one preferred embodiment, the system is implemented using a graphical user interface or "GUI" on a PC with commercially available operating systems (OS) such as Windows NT. The use of such an OS allows one to take advantage of the latest advances in technology such as symmetric multiprocessing which allows simultaneous utilization of multiple microprocessors in one computer system. Advances in computer technology, such as symmetric multiprocessing, allows one to replace functionality currently allocated to hardware by implementation in software through a set of unique algorithms.

In order to migrate functionality from hardware to software, the following general procedure is followed. Individual functional requirements are analyzed for their behavior, side effects, timing requirements, performance requirements, and interaction with other functions. A framework is then designed to accommodate the top level functions (e.g., to display images for the IDS). Wherever possible, a behavior is implemented using a collection of operating system services within the context of the general framework. If a particular behavior is not easily supported by the operating system, then algorithms are devised and inserted into the framework. The required capability is then tested both for its functionality and its performance. Certain capabilities, such as driving two monitors from one computer, for example, could not be implemented purely in software. For those situations where a total software solution is not possible, commercially available off-the-shelf (COTS) hardware is acquired along with the corresponding device drivers.

There are two other potential situations which will now be addressed. The first involves commercial hardware in which device drivers are either inadequate or not available. In this case, one needs to either modify the vendor's device driver or develop ones own. The hardware vendor must be willing to support the development since detailed engineering information will be required for device driver development to proceed. The second situation comes about when commercial hardware which meets the functional requirements of the system is unavailable. In this case, development of both the hardware and the device driver is necessary (e.g., the camera interface card).

One illustration of the process of developing a software-based control system from previous hardware functions is the development of software control of an original display system, which previously contained custom chips for image zooming and interpolation. These functions are ported to a software-based solution in two steps. Standard zooming is implemented through one of Windows NT system services. This method requires some code to tic together the various activities related to zooming (e.g., mouse movement) but utilizes the zooming capability provided by the operating system. The operating system, however, does not provide any interpolation capability. An interpolation algorithm (bicubic spline) is therefore researched, adapted, coded, and inserted into the application's framework (see file Interp.c below). The present invention includes an interpolation functionality which is now available within the application and is used to display images in the slice cursor and profile screens. These two screens display an enlarged image which requires interpolation.

Each software module which comprises the IDS is briefly explained below, with reference to the Tabs which include the source code for these modules:

Angio.c (Tab 1)

Angio.c allows the operator to produce a study of maximum intensity projected (MIP) images. A MIP image is formed at each viewing angle by taking the maximum pixel intensity encountered by a ray projected orthogonally through the study volume for each view image coordinate. The following MIP types can be produced: Orthogonal Views, Rotated Images, Tumbled Images and Panned Images. The number of images in the MIP study (and hence, the angular increment) is user selectable. If Orthogonal Views is selected, the number of images is always three. If Pan is selected, the number of images per MIP is selectable. The MIP study may be produced with and without neighborhood averaging. If a four pixel neighborhood is selected, four averaging types are available: Constant, Bilinear Interpolation, Inverse Linear and Inverse Quadratic. For a nine pixel neighborhood, Bilinear Interpolation is not available. The averaging distance threshold is adjustable for all averaging types.

If the study contains regions of interest (ROIs) only, the area of the image within the ROIs are used to generate the MIP. An additional feature provided by this file is the ability to draw (ROIs) on the orthogonal views and producing a MIP study from the union of the projection of these ROIs.

Arrows.c (Tab 2)

Arrows.c allows the user to create and display up to four arrows per image. The arrows may be used for annotating the image or highlighting areas of interest. The arrows may be maneuvered via a pointing device. They may be panned and the arrow tail length and angle may be adjusted. Additional arrows may be generated by clicking on the arrow head.

Command.c (Tab 3)

This file contains the routine DoCommand which is called from WinProc to process the WM_COMMAND system message. This is a general message which must be further decoded in order to extract the specific function and corresponding parameters requested by the user. There are approximately forty subcommands which this routine processes. For most of the commands, DoCommand simply verifies the corresponding parameters and the application state, and dispatches control to lower level routines which handle the specifics associated with the command invoked.

Cursors.c (Tab 4)

Cursors.c allows the measurement of features on the selected image. Two separately selected and graphically controlled cursors can be invoked that are movable to any part of the selected image. For each cursor, the following information is displayed: 12 bit pixel value, X-coordinate and Y-coordinate. Also, if two cursors are selected, their relative angle and distance are displayed.

Date.c (Tab 5)

This module contains routines to parse date information contained in the study's SI file. It also contains code to compute a patient's age at the time the scan was performed. The routines have been specifically designed to deal with specific date styles and as such are not particularly general purpose.

Dialog.c (Tab 6)

This file contains all of the applications dialog processing routines which include the MIP dialog, camera, preset windowing, and filtering dialog windows. Each of these routines are invoked from the DoCommand routine contained in the file command.c when the user selects the corresponding menu item from the application's menu bar.

Dopaint.c (Tab 7)

This file contains the routines required for the processing of the WM_PAINT system message. These routines are invoked directly from WinProc whenever the application receives the WM_PAINT message. It issues this message when a portion of the application's windows need to be repainted. The program can determine which portion of its window needs to be repainted by calling the GetUpdateRect system function.

Error.c (Tab 8)

The application's error handler is contained in this file. The handler will log errors to an error log and may, if the error is serious enough, shutdown the application. There is currently no exception handler for the application, although there is an exception generation routine.

Film.c (Tab 9)

This file contains the routines used to transmit filming parameters back to the host. It collects display information (e.g., zoom, windowing, etc.), converts to the host format, establishes communications with the host and transmits the filming parameters. In addition to the display information, these routines also specify the film format and the number of copies to produce. The host will uses this information to transfer the MRI images to film.

Filter.c (Tab 10)

This file allows for simultaneous sharpening, smoothing and contrast modification of the selected image. A separate screen is generated that shows two views of the selected image side-by-side. The operator can interactively sharpen, smooth and contrast adjust the image using mouse movement. Results are shown in the right image while the left image remains unmodified. The operator has control over mask size, sharpness, smoothness, sharp-smooth center and spread, whiteness, blackness and white-black center and spread. The filtering can be removed or copied to all other images in the study. Additionally, windowing may be performed from this screen. Other pertinent scan information such as scan number and slice number is displayed.

Global (Tab 11)

This file serves as a central repository for all global variables. The intent is simply to collect all globals within one file to make their management easier. Additionally, some of these variables are assigned default values in this file.

Hvsmain.c (Tab 12)

This file contains the two top most routines (WinMain and WinProc) and a couple of initialization functions. WinMain is where all execution starts. This routine displays the initial application window. Additionally, WinMain contains the message retrieval and dispatch code. WinProc receives all of the window messages for the application, which it decodes and dispatches to other routines for processing. WinProc also starts the Server thread which is responsible for communications with the host system.

Image.c (Tab 13)

This contain two major routines relative to the MRI image. The first is update_image. This routine translates the twelve bit image data to the eight bit format required by the operating system. This accomplished along with any ROI settings which may require special processing. The second routine handles image zooming and panning. The zooming routine is invoked when the application is in zoom mode and the mouse is moved. It translates pointing device to corresponding zoom and panning factors.

Interp.c (Tab 14)

Interp.c creates a bicubic spline interpolated image of arbitrary size. This routine is used to display the image in the slice cursor screen generated by SliceStack.c and the profile screen generated by Profile.c. The user also may select interpolated images when displaying a movie of the open study. The pertinent parameters are the input image height and width and the destination image height and width.

Lbtndwn.c (Tab 16)

Lbtndwn.c processes the left button down message for each operating mode. For some operating modes Such as Sharpening, SliceSelection and Profile, this routing calls a lower level routine to process the various left button down situations encountered in these screens. For other modes, it sets the cursor position, limits the cursor to the client area and resets the operating mode for other routines to handle mouse movement messages.

Lbtnup.c (Tab 17)

Lbtnup.c processes the left button up message for each operating mode. This routine's main function is to switch the mouse movement function from zoom factor to pan coordinates in the zoom operating mode.

Mipsi.c (Tab 19)

This file contains a function that takes a pointer to a binary copy of the Unix.si file, and returns a pointer to a Unix compatible.si buffer for the "MIPed" image. The contents of the pSiRaw buffer is not modified. The sizes of the chunks are obtained from the "recs_in_chunk" variable in the chunk's index record, as specified in the original Unix file. This avoids discrepancies due to differences in variable alignment between the two machines.

Mousemove.c (Tab 20)

This file contains a routine which is invoked when a mouse move message is received by the program. It does some computation and then invokes a lower level routine which is dependent on the operating mode. It is the responsibility of these lower level routines to carry out the particulars implicit in the mouse movement within the current operating context.

Nzoom.c (Tab 21)

This file contains the routines which implement the magnification glass function. This function allows a user to zoom in on a specific portion of an image. This action is similar to passing a magnifying glass over the image while inspecting it. The user is allowed to control the position of the magnifying glass is through mouse movement.

Path.c (Tab 22)

This file contains routines which will parse a Unix file path and construct a corresponding NT file path. It also contains code which will parse and translate an NT file path to a Unix file path.

pllab.c (Tab 23)

pllab.c generates a string for image plane labeling based on the three gradient angles. The gradient angles, theta, phi and psi are input to this routine and the various orientation labels are generated for display. The orientation labels are: SAG S/I, COR S/I, phi angle SC, AXI L/R, COR L/R, phi angle AC, AXI A/P, SAG A/P, and theta angle AS.

Portal.c (Tab 24)

Portal.c provides functionality related to the display of study images in the screen portals. This file contains routines that determine the selected image (active portal), clear the portals, provide all portal labeling, paint the portal to the screen, and draw the grid overlay.

Print.c (Tab 25)

This file contains routines which allow the user to print the currently active image on a local or remote printer. Support also is provided for the printer dialog box which allows the user to setup printing parameters.

Profile.c (Tab 26)

Profile.c generates a separate screen that allows for simplified scanner calibration. An image, such as a phantom, is displayed along with interactive profile cursors that provide angle, field of view and thickness information. Separate intensity, first derivative and second derivative graphs are shown as well as point cursors that show value, position and distance information. Additionally, windowing may be performed from this screen. Other pertinent scan information such as profile shifts (superior, anterior and left) is displayed.

Rbtndwn.c (Tab 27)

Rbtndwn.c processes the right button down message for each operating mode. In the normal operating mode, this routine selects the image designated as the active portal. In other operating modes this routine terminates the process and returns the system to the normal operating mode.

Render.c (Tab 28)

Render.c performs several functions related to clearing a portal and displaying cine animations. This file creates a cine animation from a displayed study. The cine may be displayed pixel replicated or may be bicubic spline interpolated. The cine labeling function is performed by this file. Another function of this file is to save onto the hard disk a cine animation as a series of image files in the BMP format.

Roi.c (Tab 29)

Roi.c allows the user to create two rectangular, one elliptical and one arbitrarily shaped region of interest (ROI). Once created, the regions may be panned to any location on the image. The rectangular and elliptical regions may be resized after creation. For each ROI created, the following information is displayed: area in pixels, mean intensity, standard deviation of intensity, width, height, X-coordinate of center and Y-coordinate of center. Each ROI may be windowed independently. Also, the created ROIs may be copied to all other images in the study.

Scroll.c (Tab 30)

Scroll.c processes WM_VSCROLL and WM_HSCROLL messages from scroll bars. This file contains the routine DoScroll that is called from WinProc. The WM_VSCROLL and WM_HSCROLL messages are general messages which must be further decoded in order to extract the specific function and corresponding parameters requested by the user. DoScroll verifies the corresponding parameters and the application state, and dispatches control to lower level routines that handle the specifics associated with the command invoked.

Security.c (Tab 31, first part)

Security.c contains all of the code that relates to the hardware security lock (the dongle). The two top most routines are 1) IsTheDongleThere and 2) IsItAStrangeDongle. These routines test for a dongle and then verify that it specify a dongle. If a dongle is not found, the application is just shutdown without any warning.

Server.c (Tab 31, second part)

This module contains the routines whose primary purpose is communications. Included are both the client and server routines for receiving study data and send, filming, scanning), and study storage information to the host. The IDS makes use of, and is dependent on, the operating system's networking software and the computer's networking hardware. This is not to say that there is a dependence on any particular network technology. The software will work with ethernet as well as FDDI with any modifications as long as the operating system supports a sockets-based TCP/IP interface to the network.

Si.c (Tab 32)

This file contains the functions required to extract information from the Study Information (SI) file. Each study is contained in two files; the first file contains all the image data and the second file (SI) contains all the study data along with the patient's demographic information.

SliceStack.c (Tab 33)

This file allows the operator to produce all necessary information for creating a scout image. A scout image is a graphical representation of the images to be produced by the upcoming scan. A separate screen is generated whereby scouting parameters are determined interactively via a graphical interface. The chosen scout image is displayed while the operator selects the various scouting parameters. Specifically, the operator selects the following information via mouse movement or keyboard input: number of stacks and number of slices per stack, angle of stack, field of view of stack slices, thickness of stack slices, slice interval and stack shifts (superior, anterior and left). Additionally, windowing may be performed from this screen. Other pertinent patient and scan information is displayed.

Study.c (Tab 34)

This file contains routines which maintain the data structure that provides the highest level of organization for the program (the study structure). Routines that initialization the structure are usually invoked whenever the application is first started or when a study is opened. The file also supplies routines that are called when a study is closed. These routines free resources associated with the study and clear fields in the study structure.

Studyop.c (Tab 35)

This file contains functions which apply to an entire study. They include the ability to copy a study, split a study, and save a study to disk.

Utilities.c (Tab 36)

This file contains a set of miscellaneous functions which do not easily fit into any of the other files. These function include general purpose routines for thread management. System shut down code and application lock management functions also are contained in this file. These routines are invoked from various parts of the application.

Figure 3A:
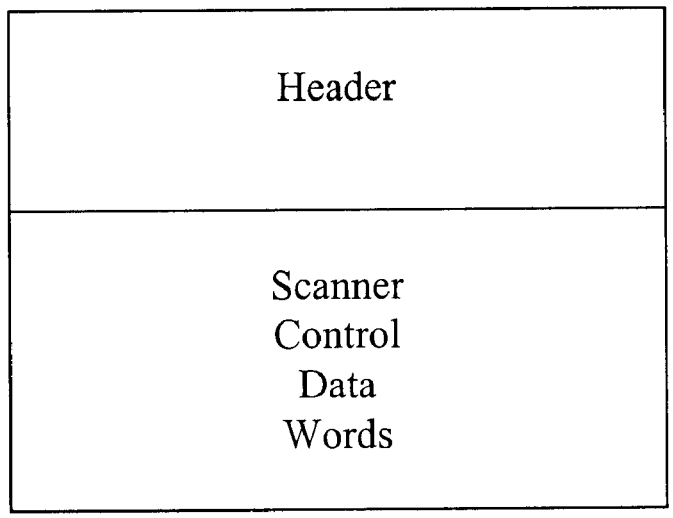
FIG. 3A shows a command block containing two sections; a Header and Scanner Control Data Words.
Figure 3B:
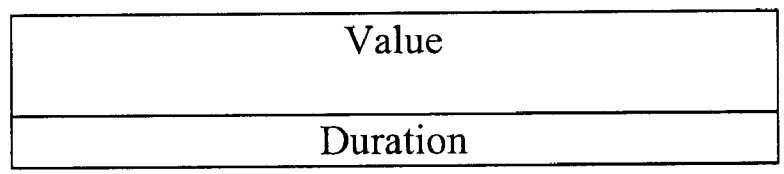
FIG. 3B shows a set of control words.

As shown in FIG. 3, the header contains information which is used by the virtual device to partition the control words into various sections (e.g., x-gradient parameters, y-gradient parameters, etc.); and The control words contain the information needed for the generation of the waveforms and data acquisition, but no hardware control data. Any hardware specifics are allocated to the back-end of the virtual device driver which isolates these components. What is not so obvious, of course, is how to isolate these items and still meet the system's performance and functional requirements without compromising the system's ability to seamlessly exploit technological advances. This problem was solved through the use of memory management subsystems which minimized the movement of control and acquired data. This data movement minimization enabled the virtual device approach because it provided the time needed to translate and deliver the data to the specific hardware components.

As these and other variations and combinations of the features discussed above can be utilized, the foregoing description of the preferred embodiments should be taken by way of illustration rather than by limitation of the invention set forth in the claims.

What is claimed is:

1. An image display system for use with a magnetic resonance image or "MRI" scanner system comprising:
   a) an image display unit for displaying scanned images from an MRI scan; and
   b) means for interactive, real time, modification of image sharpness or smoothness of a selected image slice from said display unit, through real-time, interactive control of said scanner system.

* * * * *

UNITED STATES PATENT AND TRADEMARK OFFICE
CERTIFICATE OF CORRECTION

PATENT NO. : 6,366,094 B1
DATED : April 2, 2002
INVENTOR(S) : Vassallo et al.

It is certified that error appears in the above-identified patent and that said Letters Patent is hereby corrected as shown below:

Column 1,
Line 37, "Such" should read -- such --.
Line 42, "tile" should read -- the --.

Column 3,
Line 63, delete "is".

Column 4,
Line 63, "tic" should read -- tie --.

Column 7,
Line 14, "Such" should read -- such --.
Line 49, delete "is".

Column 8,
Line 64, delete ")".

Signed and Sealed this

Second Day of July, 2002

*Attest:*

JAMES E. ROGAN
*Attesting Officer*          *Director of the United States Patent and Trademark Office*